(12) United States Patent
Kamakura

(10) Patent No.: US 10,847,392 B2
(45) Date of Patent: Nov. 24, 2020

(54) METHOD OF MANUFACTURING SEMICONDUCTOR DEVICE

(71) Applicant: KOKUSAI ELECTRIC CORPORATION, Tokyo (JP)

(72) Inventor: Tsukasa Kamakura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/560,250

(22) Filed: Sep. 4, 2019

(65) Prior Publication Data
US 2020/0098603 A1 Mar. 26, 2020

(30) Foreign Application Priority Data
Sep. 26, 2018 (JP) .................................. 2018-180011

(51) Int. Cl.
*H01L 21/67* (2006.01)
*H01L 21/02* (2006.01)

(52) U.S. Cl.
CPC .. *H01L 21/67207* (2013.01); *H01L 21/02263* (2013.01); *H01L 21/02312* (2013.01); *H01L 21/67017* (2013.01)

(58) Field of Classification Search
None
See application file for complete search history.

(56) References Cited

U.S. PATENT DOCUMENTS

| 2003/0157812 A1* | 8/2003 | Narwankar ......... C23C 16/4411 438/758 |
| 2005/0229947 A1* | 10/2005 | Spiegelman ...... H01L 21/02052 134/2 |
| 2006/0102208 A1* | 5/2006 | Jacobson .......... H01L 21/02057 134/56 R |
| 2008/0182421 A1* | 7/2008 | Nishimura .......... H01L 21/3065 438/717 |
| 2018/0138055 A1* | 5/2018 | Xu .................... H01L 21/67069 |

FOREIGN PATENT DOCUMENTS

| JP | 2006-245256 A | 9/2006 |
| JP | 2017-069407 A | 4/2017 |

OTHER PUBLICATIONS

Japanese Office Action dated Sep. 15, 2020 for Japanese Patent Application No. 2018-180011.

* cited by examiner

*Primary Examiner* — Asok K Sarkar
(74) *Attorney, Agent, or Firm* — Volpe Koenig

(57) ABSTRACT

Described herein is a technique capable of forming a film with uniform characteristics from an upper portion to a lower portion of a deep concave structure whose aspect ratio is high. According to one aspect of the technique of the present disclosure, there is provided a method of manufacturing a semiconductor device including: (a) placing a substrate comprising a deep concave structure constituted by at least an upper portion and a lower portion on a substrate support provided in a process chamber; (b) supplying a process gas into the process chamber to form a layer on an inner surface of the deep concave structure; and (c) discharging by-products generated in an inner space of the deep concave structure in (b) by setting a pressure of a process space defined by the process chamber to be lower than a pressure of the inner space of the deep concave structure.

19 Claims, 12 Drawing Sheets

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2018-180011 filed on Sep. 26, 2018, in the Japanese Patent Office, the entire contents of which are hereby incorporated by reference.

BACKGROUND

1. Field

The present disclosure relates to a method of manufacturing a semiconductor device.

2. Description of the Related Art

In recent years, patterns formed on a semiconductor device are miniaturized. For example, according to related arts, a film is formed on a surface of a deep concave structure including, for example, a deep groove or a deep hole formed on a substrate.

As the semiconductor device is miniaturized, an aspect ratio of the deep concave structure tends to increase. The film is formed on the surface of the deep concave structure with a high aspect ratio. It is required to uniformize the characteristics of the film from an upper portion to a lower portion of the deep concave structure of the high aspect ratio. For example, the characteristics of the film are characteristics such as a resistance value of the film and a density of the film.

SUMMARY

Described herein is a technique capable of forming a film with uniform characteristics from an upper portion to a lower portion of a deep concave structure even when an aspect ratio of the deep concave structure is high.

According to one aspect of the technique of the present disclosure, there is provided a method of manufacturing a semiconductor device including: (a) placing a substrate comprising a deep concave structure constituted by at least an upper portion and a lower portion on a substrate support provided in a process chamber; (b) supplying a process gas into the process chamber to form a layer on an inner surface of the deep concave structure; and (c) discharging by-products generated in an inner space of the deep concave structure in (b) by setting a pressure of a process space defined by the process chamber to be lower than a pressure of the inner space of the deep concave structure.

DETAILED DESCRIPTION

Embodiments

Hereinafter, one or more embodiments (hereinafter, simply referred to as "embodiments") according to the technique of the present disclosure will be described.

Figure 1:
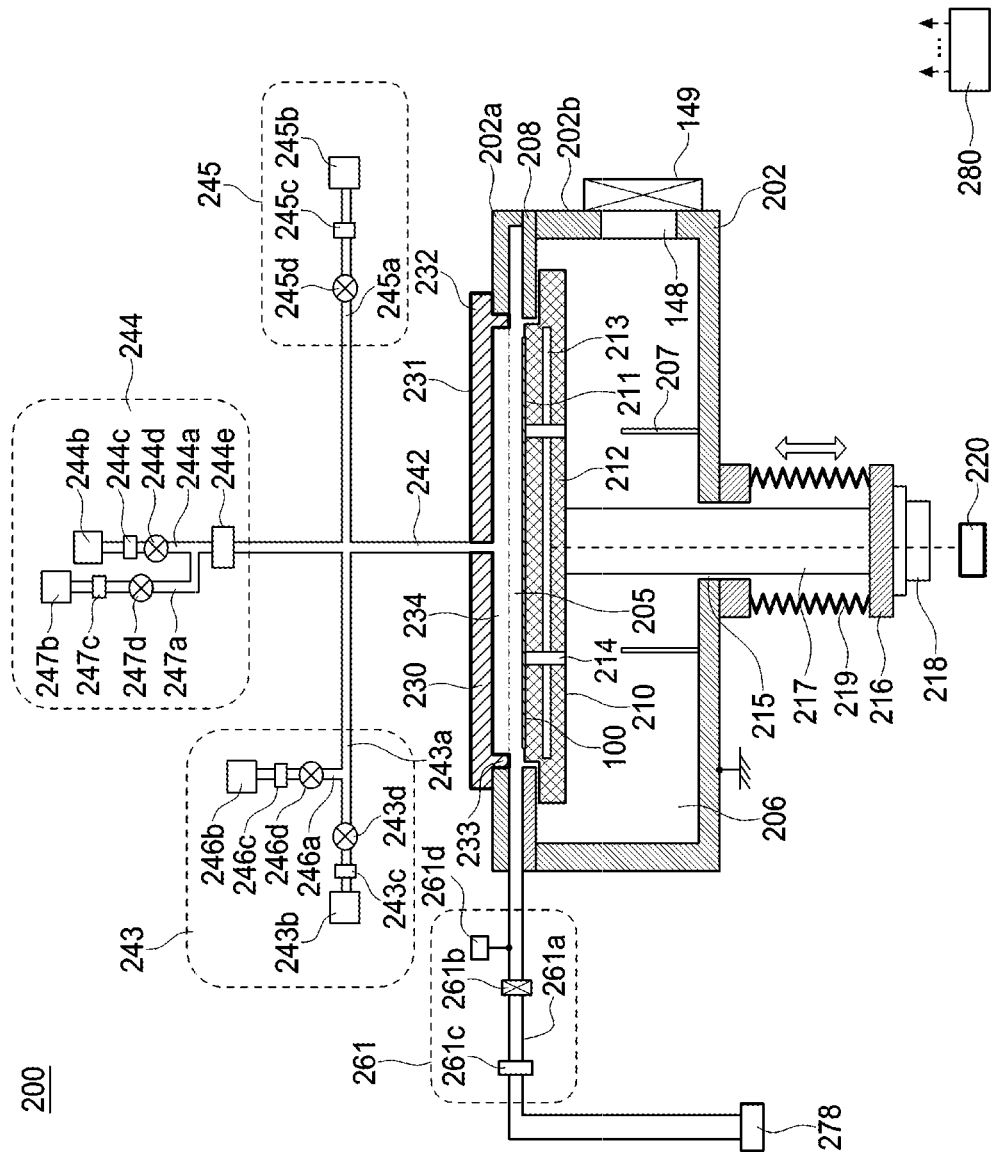
FIG. 1 schematically illustrates a vertical cross-section of a substrate processing apparatus according to one or more embodiments described herein.

An example of a substrate processing apparatus 200 of forming a film on a deep concave structure such as a deep groove and a deep hole will be described with reference to FIG. 1.

Chamber

Hereinafter, a chamber 202 will be described. The substrate processing apparatus 200 includes the chamber 202. For example, the chamber 202 is configured as a flat and sealed vessel with a circular horizontal cross-section. For example, the chamber 202 is made of a metal material such as aluminum (Al) and stainless steel (SUS). A process space 205 where a substrate 100 such as a silicon substrate is processed and a transfer space 206 through which the substrate 100 is transferred into the process space 205 are provided in the chamber 202. The chamber 202 is constituted by an upper vessel 202a and a lower vessel 202b. A partition plate 208 is provided between the upper vessel 202a and the lower vessel 202b.

A substrate loading/unloading port 148 is provided on a side surface of the lower vessel 202b adjacent to a gate valve 149. The substrate 100 is transferred (moved) between a vacuum transfer chamber (not shown) and the transfer space 206 through the substrate loading/unloading port 148. Lift pins 207 are provided at a bottom of the lower vessel 202b. The lower vessel 202b is electrically grounded.

A process chamber constituting the process space 205 is constituted by, for example, a shower head 230 and a substrate support table 212 which will be described later. A substrate support 210 capable of supporting the substrate 100 is provided in the process space 205. The substrate support 210 mainly includes the substrate support table 212 having a substrate placing surface 211 on which the substrate 100 is placed and a heater 213 serving as a heating source embedded in the substrate support table 212. Through-holes 214 penetrated by the lift pins 207 are provided at the substrate support table 212 corresponding to the locations of the lift pins 207. A temperature controller 220 capable of controlling a temperature of the heater 213 is connected to the heater 213.

The substrate support table 212 is supported by a shaft 217. A support portion of the shaft 217 penetrates a hole provided at a bottom of the chamber 202. The shaft 217 is connected to an elevating mechanism 218 outside the chamber 202 via a support plate 216. The substrate 100 placed on the substrate placing surface 211 is elevated and lowered by operating the elevating mechanism 218 by elevating and lowering the shaft 217 and the substrate support table 212. Bellows 219 covers a periphery of a lower end of the shaft 217. As a result, the interior of the chamber 202 is maintained airtight.

When the substrate 100 is transferred, the substrate support table 212 is moved downward until the substrate placing surface 211 faces the substrate loading/unloading port 148 (that is, the substrate support table 212 is moved to a substrate transfer position). When the substrate 100 is processed, the substrate support table 212 is moved upward until the substrate 100 reaches a substrate processing position in the process space 205 as shown in FIG. 1.

Specifically, when the substrate support table 212 is lowered to the substrate transfer position, upper end portions of the lift pins 207 protrude from an upper surface of the substrate placing surface 211, and the lift pins 207 support the substrate 100 from thereunder. When the substrate support table 212 is elevated to the substrate processing position, the lift pins 207 are buried from the upper surface of the substrate placing surface 211 and the substrate placing surface 211 supports the substrate 100 from thereunder.

The shower head 230 is provided above (upstream side of) the process space 205. The shower head 230 includes a cover 231. The cover 231 includes a flange 232. The flange 232 is supported by the upper vessel 202a. The cover 231 also includes a position guiding protrusion 233. The cover 231 is fixed by the position guiding protrusion 233 being engaged with the upper vessel 202a.

The shower head 230 includes a buffer space 234. The buffer space 234 refers to a space defined by the cover 231 and the position guiding protrusion 233. The buffer space 234 is spatially in communication with the process space 205. A gas supplied into the buffer space 234 is diffused in the buffer space 234 and uniformly supplied to the process space 205. According to the embodiments, the buffer space 234 and the process space 205 are separate spaces. However, the embodiments are not limited thereto. For example, the buffer space 234 may be included in the process space 205.

The process space 205 is defined by the upper vessel 202a and an upper structure of the substrate support table 212 at the substrate processing position. Structures defining the process space 205 may also be referred to as the process chamber. The structures defining the process space 205 are not limited to the above configuration as long as the process space 205 can be defined thereby.

The transfer space 206 is defined by the lower vessel 202b and a lower structure of the substrate support table 212 at the substrate processing position. Structures defining the transfer space 206 may also be referred to as a "transfer chamber", and the transfer chamber is provided under the process chamber. The structures defining the transfer space 206 are not limited to the above configuration as long as the transfer space 206 can be defined thereby.

Gas Supply System

Next, a gas supply system will be described. The gas supply system is configured to supply process gases. A first gas supply pipe 243a, a second gas supply pipe 244a and a third gas supply pipe 245a are connected to a common gas supply pipe 242.

A first process gas is supplied mainly though a first gas supply system 243 including the first gas supply pipe 243a. A second process gas is supplied mainly though a second gas supply system 244 including the second gas supply pipe 244a. An inert gas is supplied though a third gas supply system 245 including the third gas supply pipe 245a.

First Gas Supply System

A first gas supply source 243b, a mass flow controller (MFC) 243c serving as a flow rate controller (flow rate control mechanism) and a valve 243d serving as an opening/closing valve are provided at the first gas supply pipe 243a in order from an upstream side to a downstream side of the first gas supply pipe 243a.

A gas containing a first element (hereinafter, also referred to as the "first process gas") is supplied into the shower head 230 via the first gas supply pipe 243a provided with the mass flow controller 243c and the valve 243d and the common gas supply pipe 242.

The first process gas is a source gas, that is, one of the process gases. According to the embodiments, the first element may include silicon (Si). That is, the first process gas may include a silicon-containing gas. Specifically, dichlorosilane ($SiH_2Cl_2$, abbreviated as DCS) gas may be used as the silicon-containing gas.

A downstream end of a first inert gas supply pipe 246a is connected to the first gas supply pipe 243a at a downstream side of the valve 243d provided at the first gas supply pipe 243a. An inert gas supply source 246b, a mass flow controller (WC) 246c serving as a flow rate controller (flow rate control mechanism) and a valve 246d serving as an opening/closing valve are provided at the first inert gas supply pipe 246a in order from an upstream side to a downstream side of the first inert gas supply pipe 246a.

According to the embodiments, the inert gas may include nitrogen ($N_2$) gas. The inert gas acts as a carrier gas or a dilution gas of the first process gas (source gas).

The first gas supply system (also referred to as a "silicon-containing gas supply system") 243 is constituted mainly by the first gas supply pipe 243a, the mass flow controller 243c and the valve 243d.

A first inert gas supply system is constituted by the first inert gas supply pipe 246a, the mass flow controller 246c and the valve 246d. The first inert gas supply system may further include the inert gas supply source 246b and the first gas supply pipe 243a.

The first gas supply system 243 may further include the first gas supply source 243b and the first inert gas supply system.

Second Gas Supply System

A reactive gas supply source 244b, a mass flow controller (MFC) 244c serving as a flow rate controller (flow rate control mechanism) and a valve 244d serving as an opening/closing valve are provided at the second gas supply pipe 244a in order from an upstream side to a downstream side of the second gas supply pipe 244a. A remote plasma mechanism (also referred to as a "remote plasma unit" or "RPU") 244e may be provided at a downstream side of the valve 244d of the second gas supply pipe 244a to activate the reactive gas (also referred to as the "second process gas") into a plasma state.

The reactive gas is supplied into the shower head 230 via the second gas supply pipe 244a provided with the mass flow controller 244c and the valve 244d and the common gas supply pipe 242. When the reactive gas is in the plasma state, the reactive gas is excited into in the plasma state by the RPU 244e and then supplied onto the substrate 100.

The reactive gas is one of the process gases. For example, the reactive gas may include an oxygen-containing gas. For example, oxygen ($O_2$) gas may be used as the oxygen-containing gas.

The second gas supply system (also referred to as a "reactive gas supply system") 244 is constituted mainly by the second gas supply pipe 244a, the mass flow controller 244c and the valve 244d. The second gas supply system 244 may further include the reactive gas supply source 244b, the RPU 244e and a second inert gas supply system which will be described later.

The downstream end of a second inert gas supply pipe 247a is connected to the second gas supply pipe 244a at a downstream side of the valve 244d provided at the second gas supply pipe 244a. An inert gas supply source 247b, a mass flow controller (MFC) 247c serving as a flow rate controller (flow rate control mechanism) and a valve 247d serving as an opening/closing valve are provided at the second inert gas supply pipe 247a in order from an upstream side to a downstream side of the second inert gas supply pipe 247a. The inert gas is supplied into the shower head 230 via the second inert gas supply pipe 247a provided with the MFC 247c and the valve 247d, the second gas supply pipe 244a and the RPU 244e.

According to the embodiment, the inert gas acts as a carrier gas or a dilution gas of the second process gas (reactive gas). Specifically, for example, the nitrogen ($N_2$) gas may be used as the inert gas.

The second inert gas supply system is constituted mainly by the second inert gas supply pipe 247a, the MFC 247c and the valve 247d. The second inert gas supply system may further include the inert gas supply source 247b, the second gas supply pipe 244a and the RPU 244e. As described above, the second gas supply system 244 may further include the second inert gas supply system.

Third Gas Supply System

A third gas supply source 245b, a mass flow controller (MFC) 245c serving as a flow rate controller (flow rate control mechanism) and a valve 245d serving as an opening/closing valve are provided at the third gas supply pipe 245a in order from an upstream side to a downstream side of the third gas supply pipe 245a.

An inert gas serving as a purge gas is supplied into the shower head 230 via the third gas supply pipe 245a provided with the mass flow controller 245c and the valve 245d and the common gas supply pipe 242. For example, the inert gas may include the nitrogen ($N_2$) gas.

The third gas supply system 245 is constituted mainly by the third gas supply pipe 245a, the mass flow controller 245c and the valve 245d.

The inert gas supplied from the third gas supply source (also referred to as an "inert gas supply source") 245b acts as the purge gas of purging a residual gas in the chamber 202 or in the shower head 230 during a substrate processing described later.

The first gas supply system 243, the second gas supply system 244 and the third gas supply system 245 may be collectively referred to as the gas supply system. The gas supply system is configured to supply the process gases into the process space 205. The gas supply system may also refer to one of the first gas supply system 243, the second gas supply system 244, the third gas supply system 245 or combinations thereof according to the contents of the substrate processing described later.

Exhaust System

An exhaust system of exhausting an inner atmosphere of the chamber 202 is constituted mainly by a process space exhaust system 261 of exhausting an inner atmosphere of the process space 205.

The process space exhaust system 261 includes an exhaust pipe (first exhaust pipe) 261a connected to the process space 205. The exhaust pipe 261a is spatially in communication with the process space 205. An APC (Automatic Pressure Controller) 261c of adjusting the inner pressure of the process space 205 to a predetermined pressure and a pressure detector 261d of detecting the inner pressure of the process space 205 are provided at the exhaust pipe 261a. The APC 261c includes an adjustable valve body (not shown). The APC 261c is configured to adjust the conductance of the exhaust pipe 261a in response to an instruction from a controller 280 which will be described later. A valve 261b is provided at an upstream side of the APC 261c provided at the exhaust pipe 261a. The exhaust pipe 261a, the valve 261b, the APC 261c and the pressure detector 261d are collectively referred to as the process space exhaust system 261.

A dry pump (DP) 278 is provided at a downstream side of the exhaust pipe 261a. The DP 278 exhausts the inner atmosphere of the process space 205 (that is, the inner atmosphere of the process chamber) via the exhaust pipe 261a.

Controller

Figure 2:
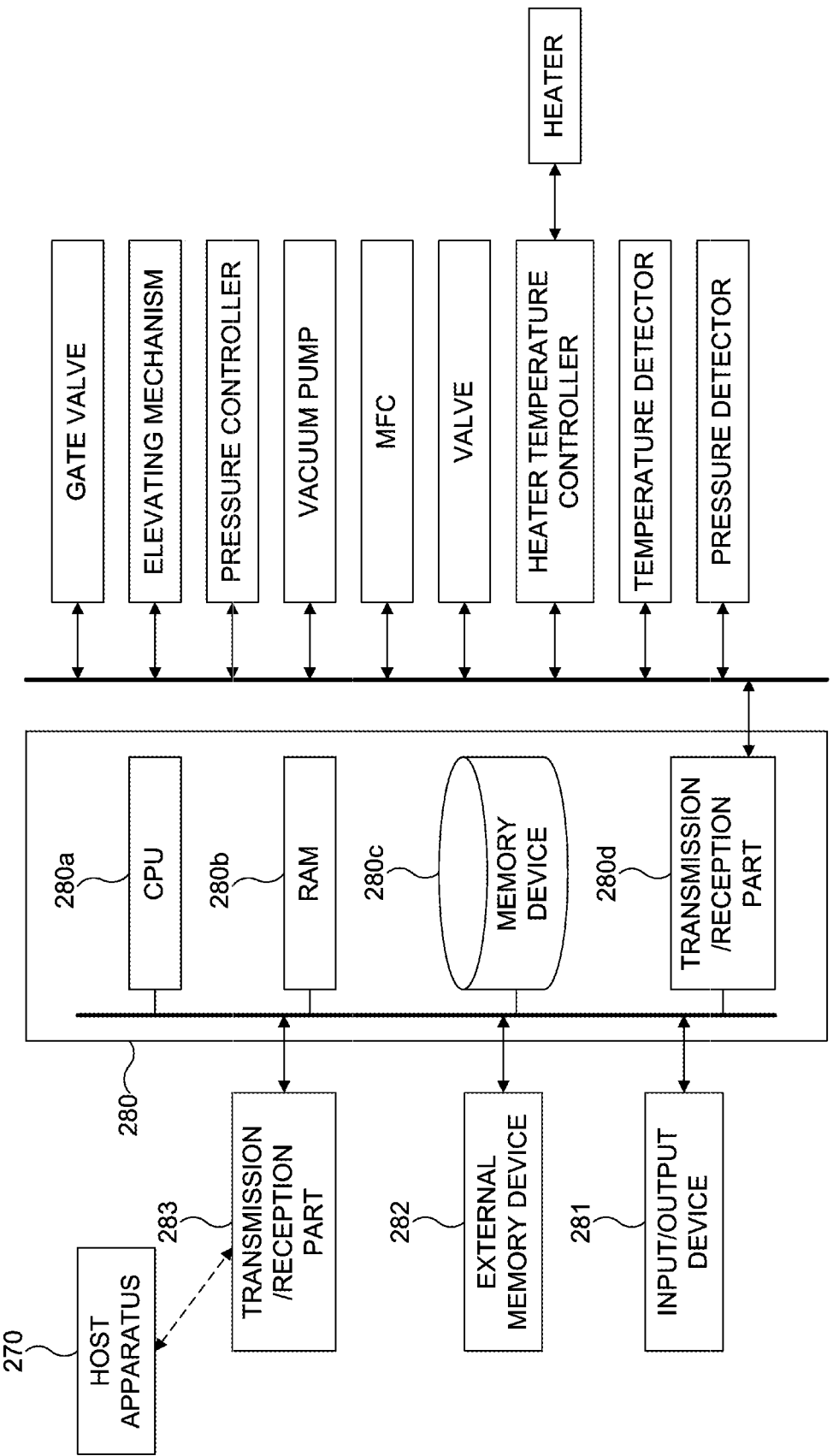
FIG. 2 is a block diagram schematically illustrating a configuration of a controller and related components of the substrate processing apparatus according to the embodiments described herein.

The substrate processing apparatus 200 includes the controller 280 configured to control the operations of components of the substrate processing apparatus 200. As shown in FIG. 2, the controller 280 includes at least a CPU (Central Processing Unit) 280a serving as an arithmetic unit, a RAM (Random Access Memory) 280b serving as a temporary memory device, a memory device 280c and a transmission/reception part 280d. The controller 280 is connected to the components of the substrate processing apparatus 200 via the transmission/reception part 280d, calls a program or a recipe from the memory device 280c in accordance with an instruction of a host controller or a user, and controls the operations of the components of the substrate processing apparatus 200 according to the contents of the instruction. The controller 280 may be embodied by a dedicated computer or as a general-purpose computer. According to the embodiments, the controller 280 may be embodied by preparing an external memory device 282 and installing the program onto the general-purpose computer using the external memory device 282. For example, the external memory device 282 may include a magnetic tape, a magnetic disk such as a flexible disk and a hard disk, an optical disk such as a CD and a DVD, a magneto-optical disk such as MO and a semiconductor memory such as a USB memory (USB flash drive) and a memory card. The means for providing the program to the computer is not limited to the external memory device 282. The program may be supplied to the computer using communication means such as the Internet and a dedicated line. The program may be provided to the computer without using the external memory device 282 by receiving the information (that is, the program) from a host apparatus 270 via a transmission/reception part 283. A user can input an instruction to the controller 280 using an input/output device 281 such as a keyboard and a touch panel.

The memory device 280*c* or the external memory device 282 may be embodied by a non-transitory computer readable recording medium. Hereafter, the memory device 280*c* and the external memory device 282 are collectively referred to as the recording medium. In the present specification, the term "recording medium" may refer to only the memory device 280*c*, only the external memory device 282 or both of the memory device 280*c* and the external memory device 282.

Semiconductor Device

Figure 3A:
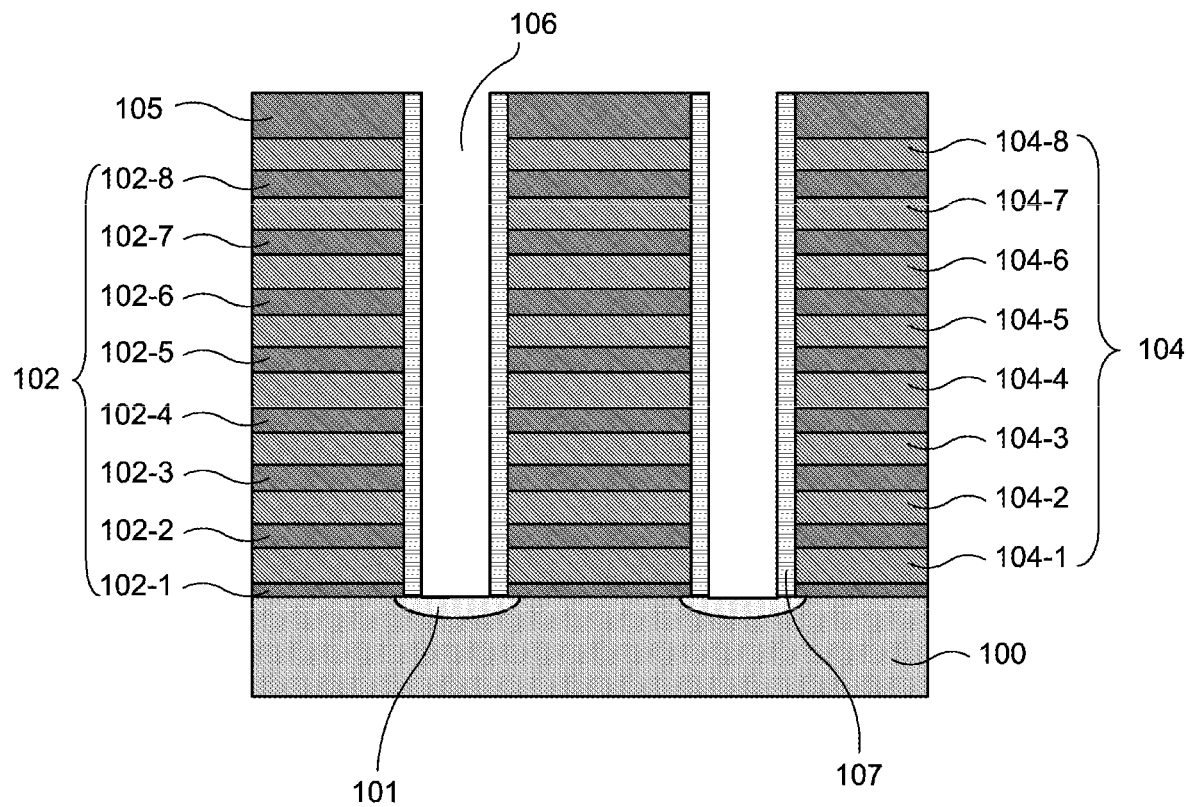
FIGS. 3A and 3B schematically illustrate a processing state of a substrate according to the embodiments described herein.
Figure 3B:
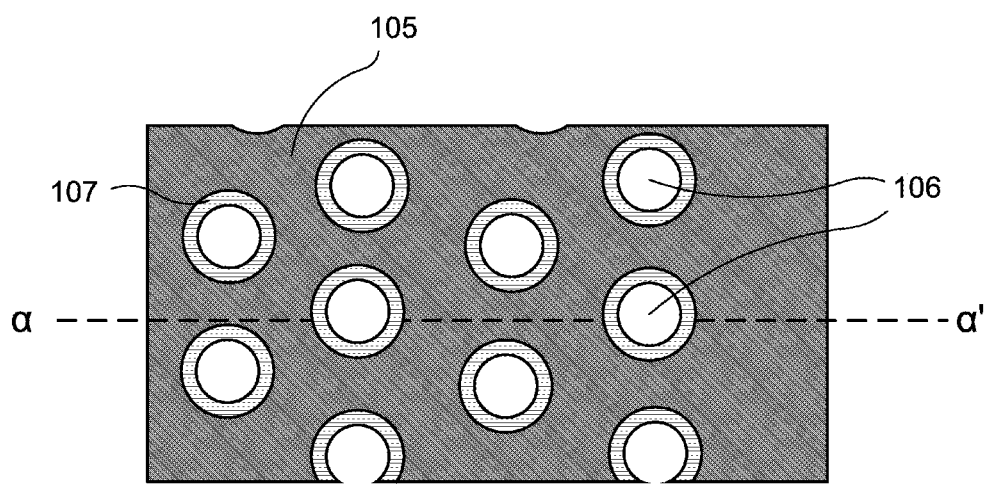
Figure 4A:
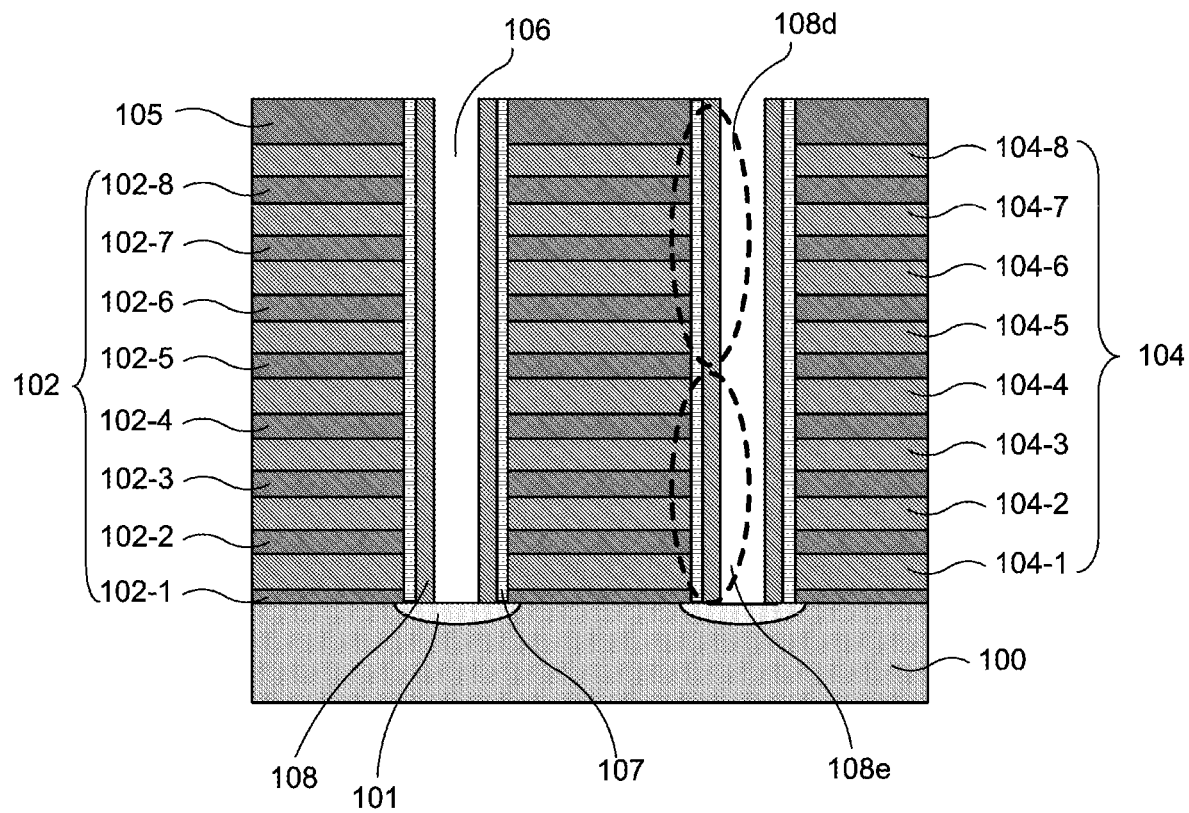
FIGS. 4A and 4B schematically illustrate a processing state of the substrate according to the embodiments described herein.
Figure 4B:
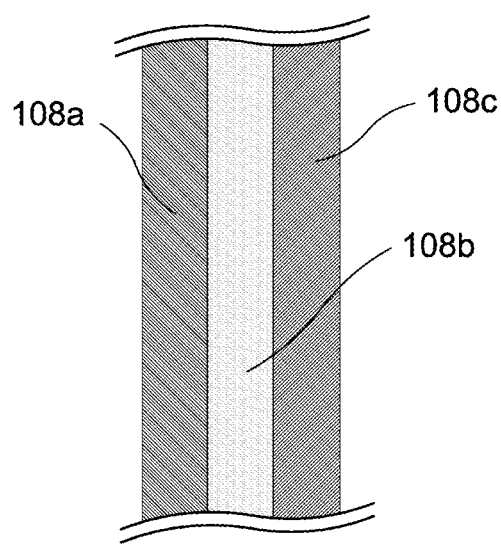
Figure 5:
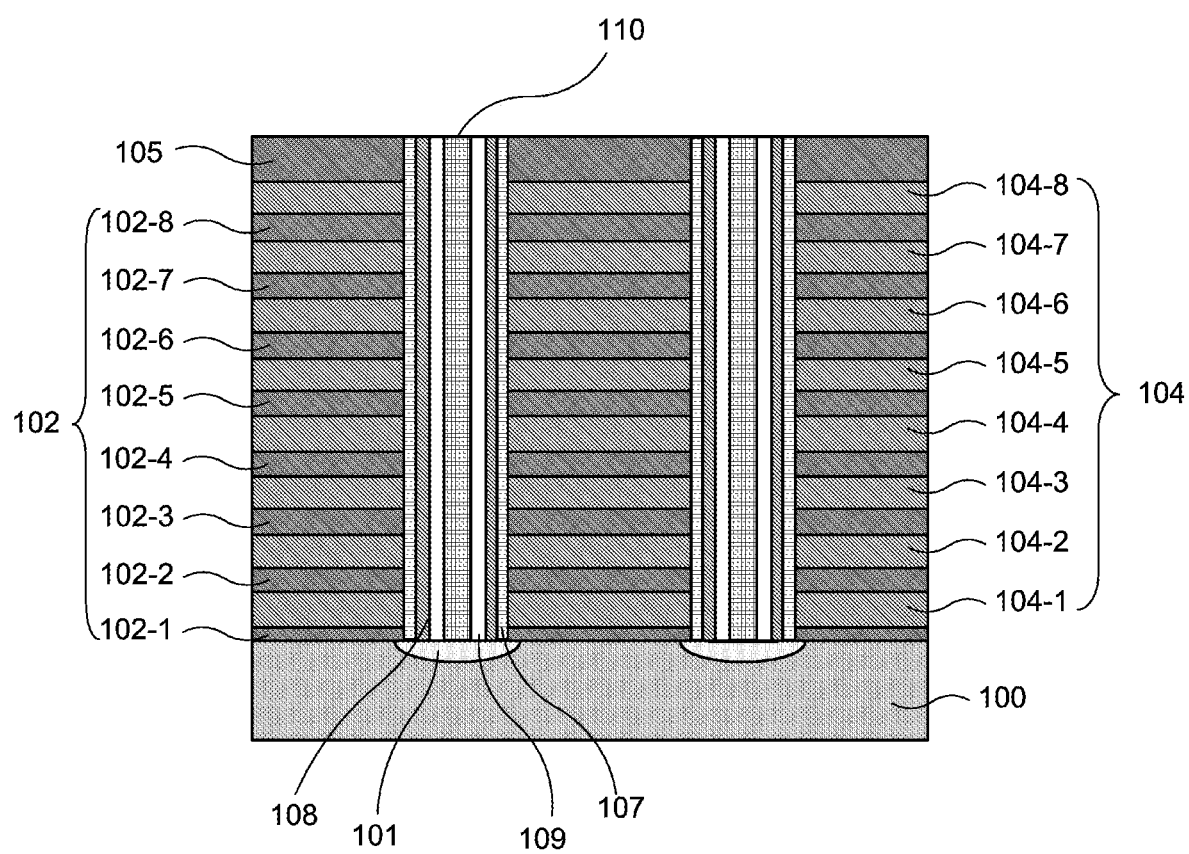
FIG. 5 schematically illustrates a processing state of the substrate according to the embodiments described herein.
Figure 6:
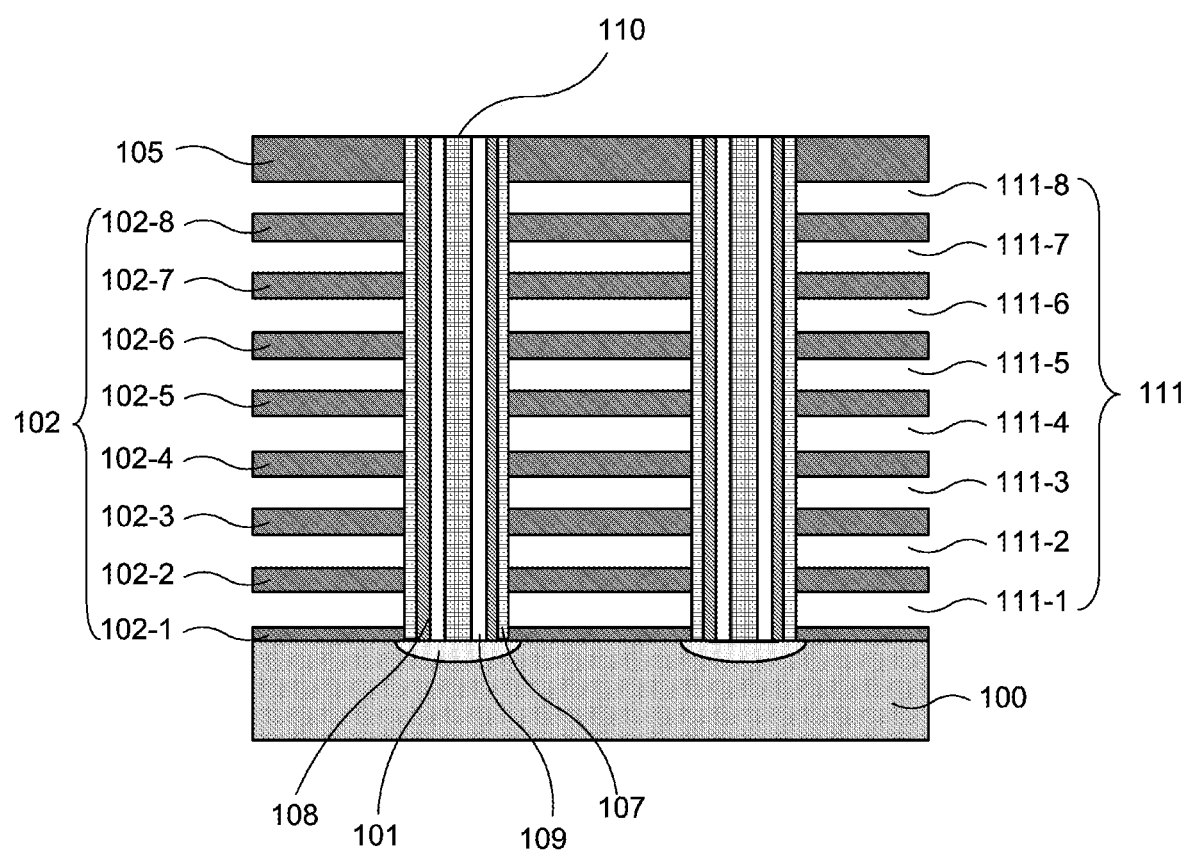
FIG. 6 schematically illustrates a processing state of the substrate according to the embodiments described herein.
Figure 7:
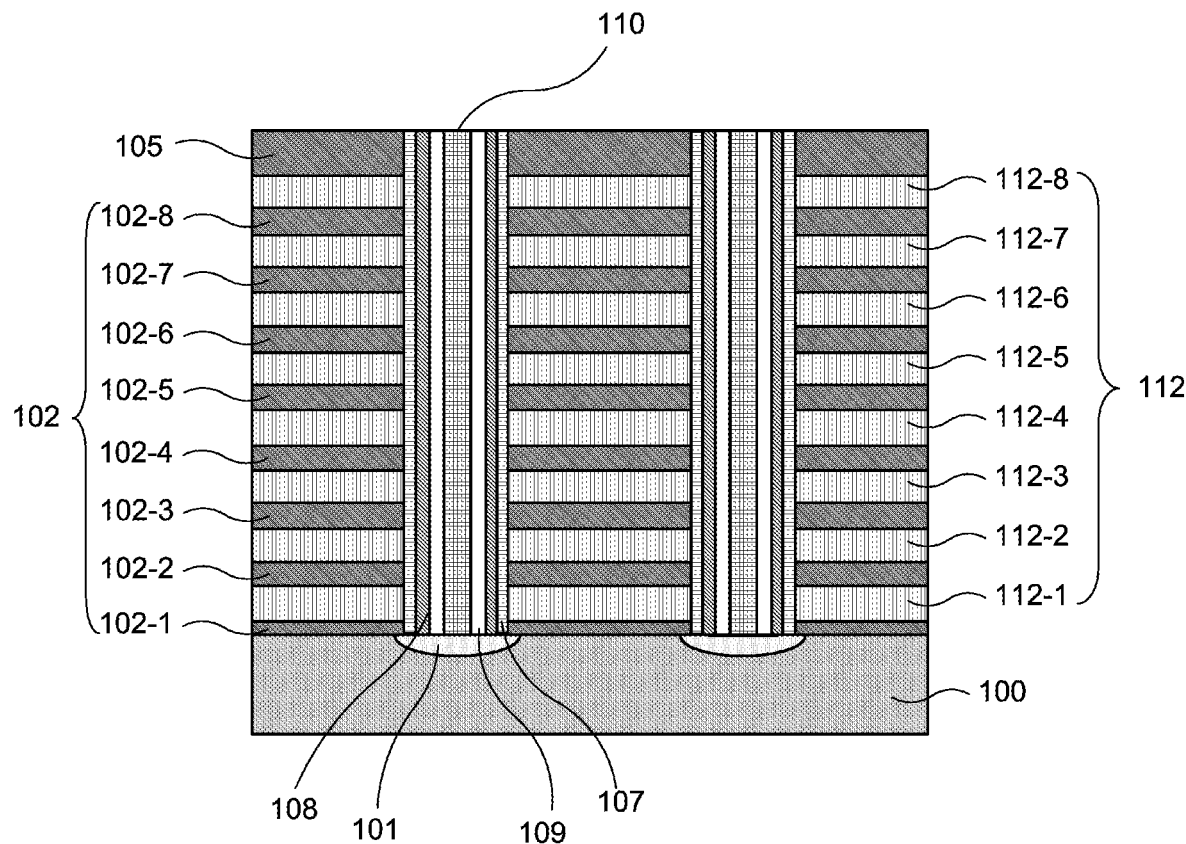
FIG. 7 schematically illustrates a processing state of the substrate according to the embodiments described herein.

Next, an example of the semiconductor device to be processed will be described with reference to FIGS. 3A through 7. The semiconductor device to be processed is, for example, a stack type memory device. FIGS. 3A and 3B schematically illustrate a processing state of the substrate 100, in which a protective film 107 is formed on an inner surface wall of a hole 160. FIGS. 4A and 4B schematically illustrate a processing state of the substrate 100, in which a stacked film 108 is formed on the protective film 107 on an inner surface wall of the hole 160 shown in FIGS. 3A and 3B. FIG. 5 schematically illustrates a processing state of the substrate 100 in which a channel polysilicon film 109 and a filler insulating film 110 are formed to fill the hole 106. FIG. 6 schematically illustrates a processing state of the substrate 100 in which a sacrificial film 104 is removed to form voids 111-1, 111-2, 111-3, 111-4, 111-5, 111-6, 111-7 and 111-8 (hereinafter, collectively referred to as a void 111). FIG. 7 schematically illustrates a processing state of the substrate 100 in which the void 111 is filled with metal films 112-1, 112-2, 112-3, 112-4, 112-5, 112-6, 112-7 and 112-8 (hereinafter, collectively referred to as a metal film 112).

First, the substrate 100 to be processed according to the embodiments of the technique will be described with reference to FIGS. 3A and 3B. FIG. 3A is a cross-sectional view of the substrate 100 and films formed thereon, and FIG. 3B is a top view of the substrate 100 and the films formed thereon. FIG. 3A is the cross-sectional view of the substrate 100 and the films formed thereon taken along the line a-a' of FIG. 3B.

As shown in FIGS. 3A and 3B, common source lines (CSL) 101 are formed on the substrate 100. An insulating film 102 is formed on the substrate 100, and the sacrificial film 104 is formed on the insulating film 102. As shown in FIGS. 3A, the insulating film 102 and the sacrificial film 104 are alternately stacked. Specifically, a sacrificial film 104-1 is formed on an insulating film 102-1, an insulating film 102-2 is formed on the sacrificial film 104-1, and a sacrificial film 104-2 is formed on the insulating film 102-2. Similarly, insulating films 102-3, 102-4, 102-5, 102-6, 102-7 and 102-8 and sacrificial films 104-3, 104-4, 104-5, 104-6, 104-7 and 104-8 are alternately formed on one another. An insulating film 105 is then formed on the sacrificial film 104-8. While eight layers of insulating films 102-1 through 102-8 and eight layers of sacrificial films 104-1 through 104-8 are alternately formed in an example shown in FIGS. 3A and 3B, the embodiments are not limited thereto. For example, insulating films of more than eight layers and sacrificial films of more than eight layers may be alternately stacked.

The hole 106 serving as the deep concave structure is formed in the insulating film 105 and a stacked film including the insulating film 102 and the sacrificial film 104 as shown in FIGS. 3A and 3B. The hole 106 exposes the common source lines 101 at the bottom (lower portion) thereof. As shown in FIG. 3B, a plurality of holes including the hole 106 is provided on a surface of the substrate 100. The protective film 107 is formed on the inner surface wall of the hole 160.

Next, referring to FIGS. 4A and 4B, the processing state of the substrate 100 in which the stacked film 108 is formed on the protective film 107 on the inner surface wall of the hole 160 shown in FIGS. 3A and 3B will be described. FIG. 4A is a cross-sectional view of the substrate 100 with the stacked film 108 formed on the protective film 107 on the inner surface wall of the hole 160, and FIG. 4B is a partial enlarged view of the stacked film 108 shown in FIG. 4A.

Referring to FIG. 4A, the protective film 107 and the stacked film 108 including an gate electrode insulating film (also referred to as an "inter-electrode insulating film") 108*a*, a charge trap film 108*b* and a tunnel insulating film 108*c* are formed in the hole 106 from a side wall surface toward the center of the hole 106. The protective film 107 and the stacked film 108 are of a cylindrical shape.

For example, the protective film 107 is constituted by a silicon oxide film or a metal oxide film. The protective film 107 is provided on the inner surface wall of the hole 106 to protect the stacked film 108 against the damages that may occur when removing the sacrificial film 104.

Referring to FIG. 4B, the stacked film 108 includes the gate electrode insulating film ($SiO_2$ film) 108*a*, the charge trap film (silicon nitride film) 108*b* and the tunnel insulating film ($SiO_2$ film) 108*c*. The gate electrode insulating film 108*a* is disposed between the protective film 107 and the charge trap film 108*b*. The tunnel insulating film 108*c* is disposed between the charge trap film 108*b* and a channel polysilicon film 109 shown in FIG. 5. The gate electrode insulating film 108*a* is formed by an alternating supply method which will be described later.

Next, referring to FIG. 5, the processing state of the substrate 100 in which the channel polysilicon film 109 and the filler insulating film 110 are formed in the hole 160 shown in FIG. 4A will be described. The channel polysilicon film 109 and the filler insulating film 110 are formed on a surface of the stacked film 108. The channel polysilicon film 109 is of a cylindrical shape. The hole 106 is filled with the films such as the protective film 107, the stacked film 108, the channel polysilicon film 109 and the filler insulating film 110 as described above.

After the hole 106 is filled with the films described above, the sacrificial film 104 is removed by an etching process.

FIG. 6 schematically illustrates the processing state of the substrate 100 in which the sacrificial film 104 is removed by the etching process. As shown in FIG. 6, the void 111 serving as the deep concave structure is formed where the sacrificial film 104 is removed. That is, the void 111 (that is, the voids 111-1 through 111-8) and the insulating film 102 (that is, the insulating films 102-1 through 102-8) are alternately arranged.

FIG. 7 schematically illustrates the processing state of the substrate 100 in which the void 111 is filled with the metal film 112. That is, the metal film 112 (that is, the metal films 112-1 through 112-8) and the insulating film 102 (that is, the insulating films 102-1 through 102-8) are alternately arranged (stacked).

The purpose of uniformizing the characteristics of the films formed in the concave structure such as the hole 106 will be described with reference to FIGS. 4A, 8 and 9. A reference numeral 108d in FIG. 4A indicates an upper portion of the stacked film 108, and a reference numeral 108e in FIG. 4A indicates a lower portion of the stacked film 108. That is, the upper portion 108d is a part of the stacked film 108 formed at an upper portion of the hole 106, and the lower portion is a part of the stacked film 108 formed at a lower portion of the hole 106.

Figure 8:
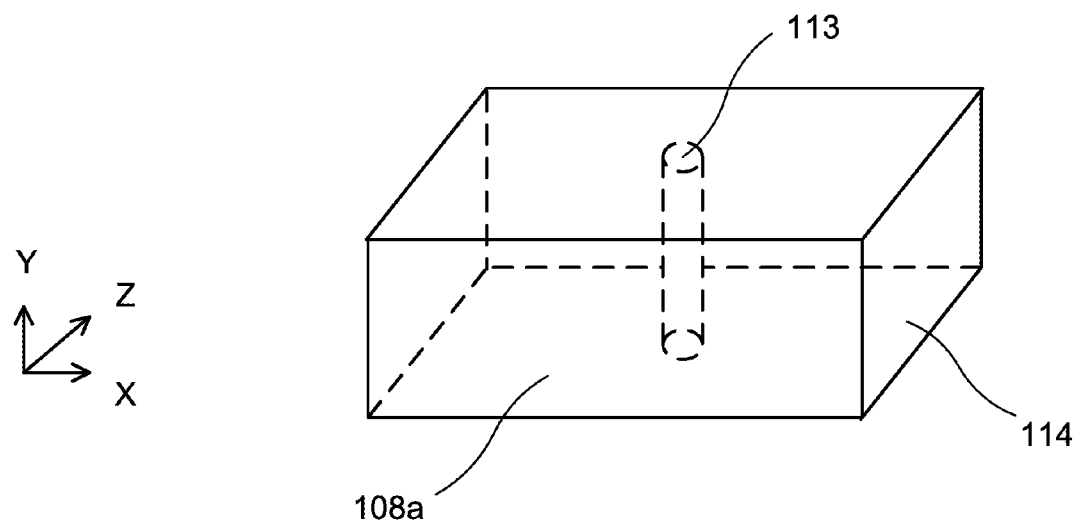
FIG. 8 schematically illustrates a processing state of the substrate according to the embodiments described herein.
Figure 9:
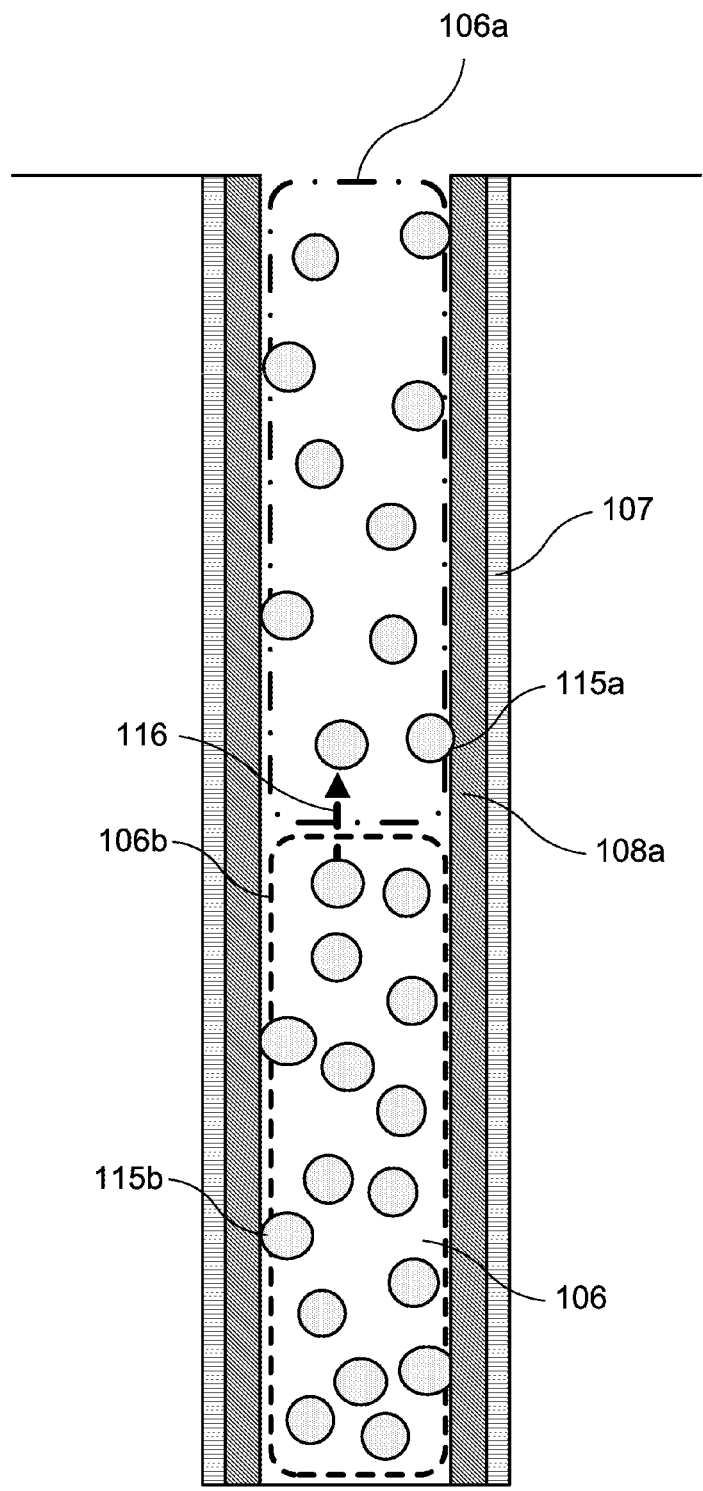
FIG. 9 schematically illustrates a processing state of the substrate according to the embodiments described herein.

FIG. 8 schematically illustrates a processing state of the substrate 100 in which the gate electrode insulating film 108a is illustrated as an example. Referring to FIG. 8, a low density portion 113 and a high density portion 114 exist in the gate electrode insulating film 108a. The low density portion 113 is a portion of the gate electrode insulating film 108a whose film composition density is lower than a desired film composition density. The low density portion 113 is also referred to as a "pinhole". The high density portion 114 is a portion of the gate electrode insulating film 108a satisfying the desired film composition density. The film composition density of the low density portion 113 is lower than that of the high density portion 114.

As described above, the gate electrode insulating film 108a is provided adjacent to the charge trap film 108b. That is, in FIG. 5, the gate electrode insulating film 108a is provided adjacent to the charge trap film 108b in the XY-plane. When the gate electrode insulating film 108a has a predetermined film composition density, the gate electrode insulating film 108a is capable of suppressing the leakage current from the charge trap film 108b. However, when the film composition density of the gate electrode insulating film 108a is lower than the predetermined film composition density, the leakage current occurs. That is, although the leakage current may not occur in the high density portion 114, the leakage current may occur in the low density portion 113.

In addition to the problems described above based on the gate electrode insulating film 108a in FIG. 8, problems when a film composition of a metal film used for components such as a circuit is non-uniform will be described. When the metal film is used, for example, an insulating film is formed so as to be adjacent to the metal film in the XY-plane. Therefore, the electric charges flowing in the metal film flow in the X-axis direction. Since the resistance values of the high density portion 114 and the low density portion 113 are different, the amount of the electric charges flowing in the metal film may be different or the flow of the electric charges may be disturbed.

When the film composition density varies as described above, the characteristics of the semiconductor device may deteriorate.

Subsequently, it will be described as to why the variation occurs in the film composition density of the deep concave structure such as the hole 106 with reference to FIG. 9. FIG. 9 schematically illustrates a processing state of the substrate 100 in which a film such as the gate electrode insulating film 108a is formed on an inner surface wall of the deep concave structure such as the hole 106. When the film such as the gate electrode insulating film 108a is formed on the inner surface wall of the deep concave structure by the alternating supply method shown in FIG. 10 which will be described later, by-products are generated in a space in the deep concave structure (that is, the hole 106 in FIG. 9). In the present specification, the term "by-products" refers to, for example, a surplus portion of a gas such as one of the process gases that failed to bond with a base film (also referred to as an "underlying film"), or materials different from the components of the film generated by the reaction of the gas.

According to the alternating supply method of the embodiments, the by-products may be generated when the first process gas remains as surplus in a first process gas supplying step S202 which will be described later. The by-products may also be generated when a precursor of the first process gas formed on the base film reacts with the second process gas in a second process gas supplying step S206 which will be described later.

Hereinafter will be described the film formed when the gas such as one of the process gases is supplied in the presence of the by-products. In a region where the by-products are present, the by-products exist between the base film and the gas. Therefore, the gas may not adhere to the base film, or the film containing the by-products may be formed. As a result, when the gas is supplied in the presence of the by-products, the film may be formed with a low film composition density.

In order to remove the by-products from the deep concave structure, a first purging step S204 which will be described later is performed after the first process gas supplying step S202, or a second purging step S208 which will be described later is performed after the second processing gas supplying step S206. In a conventional purging step, the inert gas is supplied into the process chamber. It is preferable that the conventional purging step is performed for a short time from the viewpoint of the productivity.

However, as a result of intensive research, the inventor of the present application discovered that it is possible to remove the by-products generated in an upper portion of the deep concave structure by the conventional purging step, but it is difficult to remove the by-products generated in a lower portion of the deep concave structure by the conventional purging step. For example, in FIG. 9, it is possible to remove the by-product 115a in the upper portion 106a of the hole 106, but it is difficult to remove the by-products 115b in the lower portion 106b of the hole 106. As a result, a density of the by-product 115 is different between the upper portion 106a of the hole 106 and the lower portion 106b of the hole 106. As a result, the film composition density (film density) may vary between the upper portion 106a of the hole 106 and the lower portion 106b of the hole 106, for example, between the gate electrode insulating film 108a and the gate electrode insulating film 108b. Therefore, defects may occur when a film is formed thereafter. For example, the reliability of the semiconductor device may deteriorate due to the occurrence of the leakage current or the variation in the film density when the defects occur.

The reasons why the by-products generated in the lower portion of the deep concave structure are difficult to remove are considered as follows.

The first reason is that the purge gas in the conventional purging step does not reach the bottom of the deep concave structure. As described above, in the purging step, the inert gas serving as the purge gas is supplied into the process chamber. The by-products in the upper portion of the deep concave structure are extruded by the purge gas supplied to the upper portion of the deep concave structure. In FIG. 9, the by-products 115a are extruded by the purge gas. However, when the purging step is performed for a short time, it is difficult to supply the purge gas to the lower portion of the deep concave structure. In order to supply the purge gas to the bottom of the deep concave structure, it is necessary to increase a flow rate of the purge gas or to lengthen the time duration (supply time) of supplying the purge gas. However, from the viewpoint of the productivity, it is not preferable to increase the flow rate of the purge gas significantly or to lengthen the time duration in the purging step.

The second reason is that the by-products in the upper portion of the deep concave structure hinder the movement of the by-products in the lower portion of the deep concave structure. In the purging step, as described above, the inert gas is supplied to the deep concave structure. However, the inert gas is also supplied to the surface of the substrate 100 when the inert gas is supplied to the deep concave structure. Therefore, a pressure on the surface of the substrate 100 where the gas (inert gas) is supplied is lower than the pressure in the deep concave structure. When the gas flows from the deep concave structure to the surface of the substrate 100, it is possible to discharge (remove) the by-products existing in the upper portion of the deep concave structure from the deep concave structure along the flow of the gas. However, in the lower portion of the deep concave structure, the by-products 115a in the upper portion of the deep concave structure hinder the movement of the by-products 115b when the by-products 115b in the lower portion of the deep concave structure move as indicated by the arrow 116 in FIG. 9. Therefore, the-byproducts remain in the lower portion of the deep concave structure.

Thus, it is difficult to remove the by-products generated in the lower portion of the deep concave structure. Therefore, the composition of the film formed in the concave structure is uneven (non-uniform) between the upper and lower portions of the deep concave structure.

Therefore, in the embodiments, the substrate processing is performed to remove the by-products in the lower portion of the deep concave structure even when the purging step is performed for a short time. Hereinafter, specific embodiments according to the technique will be described.

First Embodiment

Hereinafter, a first embodiment will be described.

Substrate Processing

Figure 10:
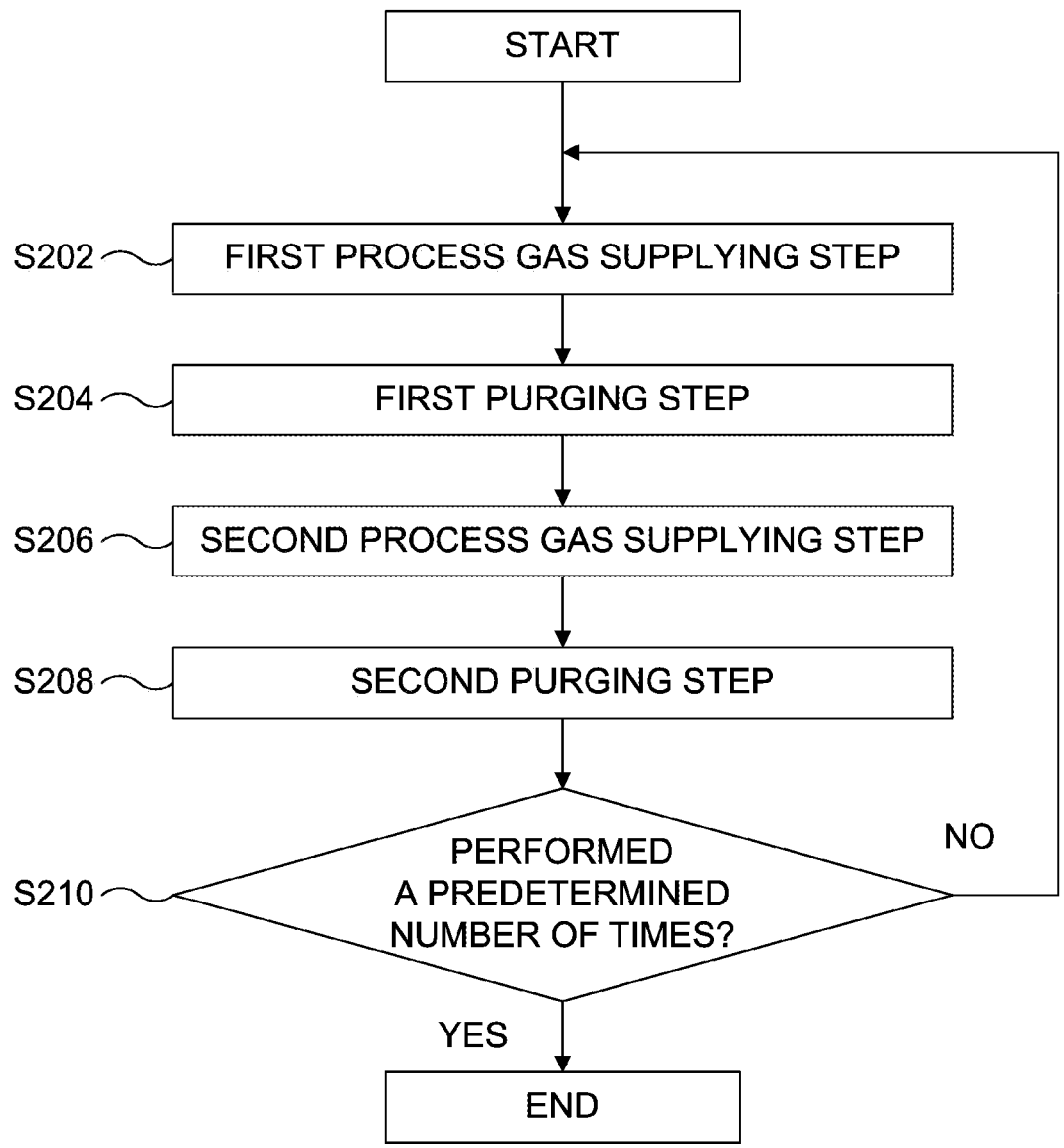
FIG. 10 is a flow chart schematically illustrating a process flow of manufacturing a semiconductor device according to a first embodiment described herein.
Figure 11:
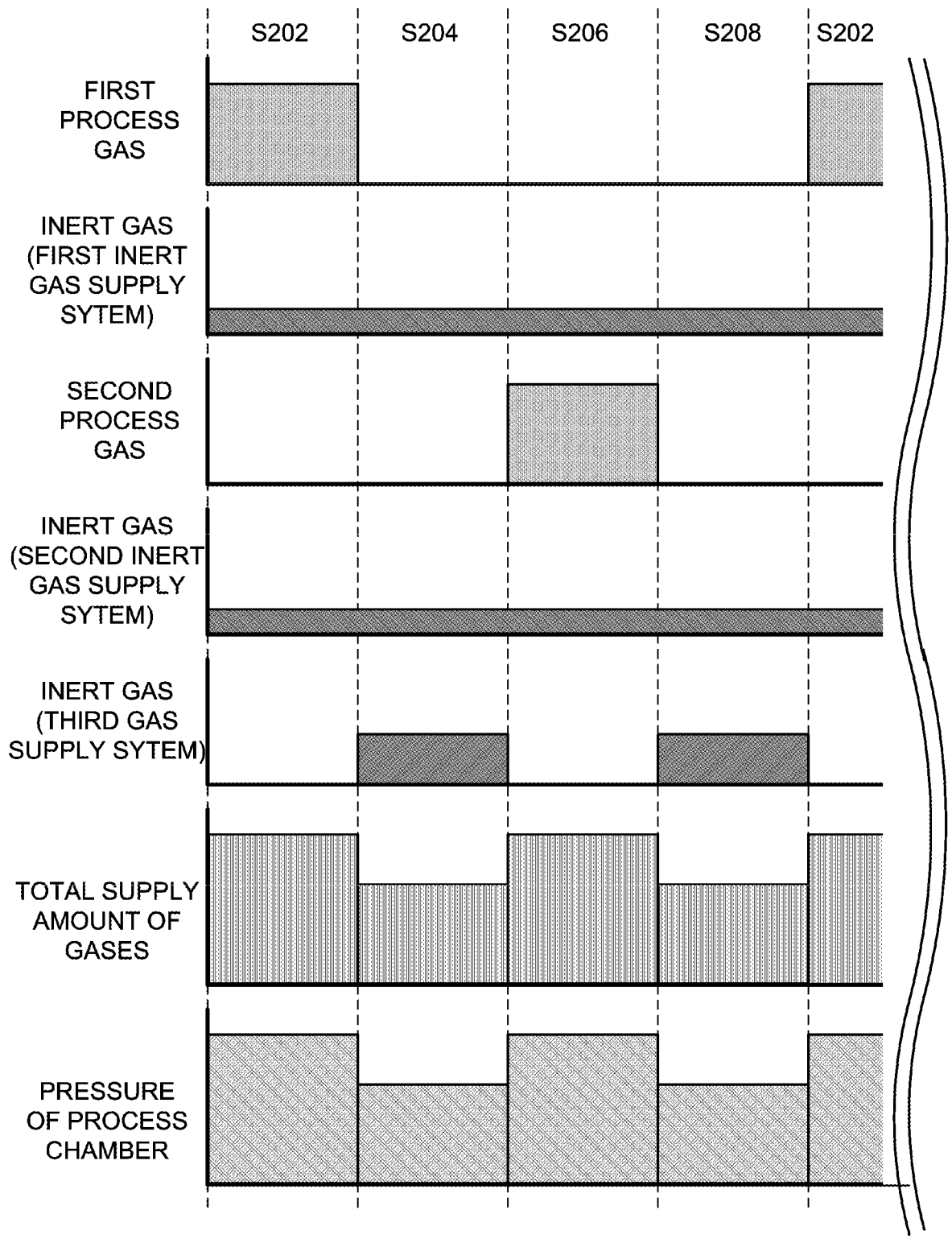
FIG. 11 schematically illustrates relations among the process flow of manufacturing the semiconductor device, flow rates of gases and a pressure of a process space according to the first embodiment described herein.

The substrate processing using the substrate processing apparatus 200 will be described with reference to FIGS. 10 and 11. FIG. 10 is a flow chart schematically illustrating a process flow of the substrate processing and FIG. 11 schematically illustrates relations among the process flow of the substrate processing, flow rates of gases and a pressure of a process chamber according to the first embodiment described herein.

By performing the substrate processing, for example, the composition of the film formed in the hole 106 serving as the deep concave structure or formed in the void 111 is uniformized. In the following description, the operations of the components of the substrate processing apparatus 200 are controlled by the controller 280.

The first embodiment will be described by way of an example in which the substrate 100 on which the protective film 107 is formed as shown in FIG. 3 is transferred (loaded) into the process chamber and is processed to form the gate electrode insulating film 108a.

Substrate Loading and Placing Step

A substrate loading and placing step will be described. In FIG. 10, the illustration of the substrate loading and placing step is omitted. The substrate support table 212 of the substrate processing apparatus 200 is lowered to the position for transferring the substrate 100 (that is, the substrate transfer position described above), and the lift pins 207 penetrate the through-holes 214 of the substrate support table 212. As a result, the lift pins 207 protrude from the surface of the substrate support table 212 with a predetermined height.

Subsequently, the gate valve 149 is opened to spatially connect the vacuum transfer chamber (not shown) to the transfer space 206. Then, the substrate 100 is loaded (transferred) into the transfer space 206 from the vacuum transfer chamber, and is placed on the lift pins 207 by a substrate transfer device (not shown). As a result, the substrate 100 is placed onto the lift pins 207 protruding from the surface of the substrate support table 212 and is supported by the lift pins 207 in horizontal orientation. In the substrate loading and placing step, the substrate 100 in which the protective film 107 is formed in the hole 106 of the substrate 100 as shown in FIG. 3 is placed on the lift pins 207.

After the substrate 100 is transferred into the chamber 202, the substrate transfer device is retracted to the outside of the chamber 202, and the gate valve 149 is closed to seal the chamber 202. Thereafter, the substrate support table 212 is elevated to transfer the substrate 100 onto the substrate placing surface 211 and then further elevated until the substrate 100 is at the substrate processing position in the process space 205 described above.

After the substrate 100 is loaded into the transfer space 206 and elevated to the substrate processing position in the process space 205, the valve 261b is opened to communicate the process space 205 with the APC 261c. By adjusting the conductance of the exhaust pipe 261a, the APC 261c maintains the pressure of the process space 205 (that is, the inner pressure of the process space 205) at a predetermined pressure (for example, a high vacuum of $10^{-5}$ Pa to $10^{-1}$ Pa).

When the substrate 100 is placed on the substrate support table 212, electrical power is supplied to the heater 213 embedded in the substrate support table 212 such that a temperature (surface temperature) of the substrate 100 is adjusted to a predetermined temperature. The predetermined temperature of the substrate 100 may range, for example, from the room temperature to 800 ° C., preferably from the room temperature to 500 ° C. The controller 280 calculates a control value based on the temperature information detected by a temperature sensor (also referred to as a "temperature detector") (not shown), and controls the temperature controller 220 to control the state of electric conduction to the heater 213 based on the calculated control value to adjust the temperature of the heater 213.

Next, a method of forming a film in the deep concave structure according to the substrate processing will be described in detail. Specifically, an example wherein the gate electrode insulating film 108a constituted by a silicon oxide film is formed will be described with reference to FIGS. 10 and 11. FIG. 10 is the flowchart schematically illustrating the process flow of the substrate 100, and FIG. 11 schematically illustrates the steps of the process flow, the flow rates of the gases supplied to the process space 205 and the pressure of the process space 205 during the substrate processing.

The first process gas, the inert gas supplied through the first inert gas supply system, the second process gas, the inert gas supplied through the second inert gas supply system, the inert gas supplied through the third gas supply system, a total supply amount of the gases supplied in each of the steps and the pressure of the process space 205 (that is, the pressure of the process chamber) are illustrated in order from top to bottom in FIG. 11. Each of the vertical axes shown in FIG. 11 represents the magnitude of the flow rate of each of the gases, the magnitude of the total supply amount (also referred to as "total flow rate") of the gases or the magnitude of the pressure of the process space 205.

After elevating the temperature of the substrate 100 to a substrate processing temperature, the following substrate processing accompanied by a heat treatment process is performed while maintaining the temperature of the substrate 100 at a predetermined temperature. That is, the substrate 100 is processed by supplying the process gases to the surface (processing surface) of the substrate 100 accommodated in the chamber 202 through the common gas supply pipe 242 and the shower head 230.

Hereinafter, the substrate processing will be described by way of an example wherein the DCS gas is used as the first process gas and the oxygen ($O_2$) gas is used as the second process gas to form the silicon oxide film in the deep concave structure of substrate 100. In the first embodiment, the alternating supply method (also referred to as an "alternating supply process") of alternately supplying different process gases is performed.

First Process Gas Supplying Step S202

The first process gas supplying step S202 will be described. In the first process gas supplying step S202, after the temperature of the substrate 100 reaches a desired temperature (that is, the predetermined temperature described above), the valve 243d is opened to supply the DCS gas. The flow rate of the DCS gas is adjusted to a predetermined flow rate by the mass flow controller 243c. For example, the predetermined flow rate of the DCS gas supplied in the first process gas supplying step S202 may range from 100 sccm to 800 sccm.

In the first process gas supplying step S202, the $N_2$ gas is supplied through the first inert gas supply system. The inert gas supplied through the first inert gas supply system is used as a carrier gas of the DCS gas. In the first process gas supplying step S202, the inert gas may be supplied through the second inert gas supply system. The inert gas supplied through the second inert gas supply system acts as a gas curtain that prevents the DCS gas from entering the gas supply pipe 244a.

In the first process gas supplying step S202, as shown in FIG. 11, when the flow rate of the inert gas supplied through the first inert gas supply system is set to 1 [arbitrary unit], the flow rate of the DCS gas is set to 4, and the flow rate of the inert gas supplied through the second inert gas supply system is set to 1. Therefore, the total flow rate is set to 6 in the first process gas supplying step S202.

The DCS gas supplied to the process space 205 via the buffer space 234 is thermally decomposed into a component such as a silicon component, and the component such as the silicon component is supplied onto the substrate 100. A silicon-containing layer serving as a first element-containing layer is formed on the surface of the deep concave structure when the silicon component contacts with the surface of the deep concave structure. The silicon-containing layer serves as a precursor for the film to be formed. In addition, a surplus component is generated as the by-products in an inner space of the deep concave structure.

In the first process gas supplying step S202, the pressure detector 261d detects the pressure of the process space 205. The controller 280 receives the pressure of the process space 205 detected by the pressure detector 261d. The controller 280 controls the mass flow controller 243c, the mass flow controller 246c, the mass flow controller 247c and the APC 261c such that the pressure of the process space 205 is within a predetermined range.

In the first process gas supplying step S202, the controller 280 controls the pressure of the process space 205 and the pressure of the transfer space 206 such that the pressure of the process space 205 and the pressure of the transfer space 206 are at a predetermined pressure ranging from 50 Pa to 300 Pa, respectively. For example, the predetermined pressure is set to 250 Pa.

By processing the substrate 100 at the high pressure as described above, it is possible to supply the DCS to the bottom (lower portion) of the deep concave structure. Therefore, it is possible to supply the silicon component in a decomposed state to bottom of the deep concave structure, and as a result, it is possible to form the silicon-containing layer on a surface of the protective film 107.

After a predetermined time elapses, the valve 243d is closed to stop the supply of the DCS gas.

First Purging Step S204

The first purging step S204 will be described. In the first purging step S204, the valve 245d is opened to supply the $N_2$ gas through the third gas supply pipe 245a. By supplying the $N_2$ gas through the third gas supply pipe 245a, it is possible to purge the by-products present in the shower head 230, the process space 205 and the deep concave structure. Simultaneously, the inert gas such as the $N_2$ gas is supplied through the first inert gas supply pipe 246a and the second inert gas supply pipe 247a.

In the first purging step S204, as shown in FIG. 11, when the flow rate of the inert gas supplied through the first inert gas supply system in the first gas supplying step S202 is set to 1 [arbitrary unit], the flow rate of the inert gas supplied through the second inert gas supply system is set to 1, and the flow rate of the inert gas supplied through the third gas supply system is set to 2. Therefore, the total flow rate is set to 4 in the first purging step S204.

Similar to the first process gas supplying step S202, in the first purging step S204, the pressure detector 261d detects the pressure of the process space 205. The controller 280 receives the pressure of the process space 205 detected by the pressure detector 261d. The controller 280 controls the mass flow controller 245c, the mass flow controller 246c, the mass flow controller 247c and the APC 261c such that the pressure of the process space 205 is equal to a predetermined pressure.

In the first purging step S204, the total flow rate is set to be lower than the total flow rate in the first process gas supplying step S202, which is performed immediately before the first purging step S204, and the pressure of the process space 205 is set to the predetermined pressure lower than that of the first process gas supplying step S202. By setting the total flow rate and the pressure of the process space 205 as described above, it is possible to set (adjust) the pressure of the process space 205 (that is, the pressure on the surface of the substrate 100) to be lower than the pressure of the lower portion of the concave structure. Hereinafter, the purpose of setting the pressure of the process space 205 in the first purging step S204 as described above will be described.

As described above, in the conventional purging step, the by-products are generated in the upper and lower portions of the inner space of the deep concave structure, and in the conventional purging step, the by-products in the upper portion of the deep concave structure hinder the movement of the by-products in the lower portion of the deep concave structure. Therefore, the-byproducts remain in the lower portion of the deep concave structure.

However, according to the first embodiment, the pressure of the process space 205 is set to be lower than that of the inner space of the deep concave structure. As a result, a pressure difference is generated between the process space 205 and the inner space of the deep concave structure, and it is possible to form a gas flow from the deep concave structure to the process space 205. By the gas flow, the by-products present in the upper portion of the deep concave structure are discharged into the process space 205.

Since the amount of the by-products in the upper portion of the deep concave structure is reduced, the by-products in the upper portion of the deep concave structure are less likely to hinder the movement of the by-products in the lower portion of the deep concave structure. Therefore, it is possible to easily discharge the by-products in the lower portion of the deep concave structure.

As described above, even when processing the substrate including the deep concave structure, it is possible to discharge the by-products remaining in the deep concave structure. Therefore, it is possible to form a layer of uniform composition in the deep concave structure.

Second Process Gas Supplying Step S206

The second process gas supplying step S206 will be described. After the first purging step S204 is completed by closing the valve 245d, in the second process gas supplying step S206, the valve 244d is opened to supply the oxygen gas into the process space 205 via the shower head 230.

In the second process gas supplying step S206, the N$_2$ gas is supplied through the first inert gas supply system. The inert gas supplied through the first inert gas supply system acts as a gas curtain that prevents the oxygen gas from entering the gas supply pipe 243a. The inert gas supplied through the second inert gas supply system is used as a carrier gas or a dilution gas of the oxygen gas.

In the second process gas supplying step S206, as shown in FIG. 11, when the flow rate of the inert gas supplied through the first inert gas supply system is set to 1 [arbitrary unit], the flow rate of the oxygen gas serving as the second process gas is set to 4, and the flow rate of the inert gas supplied through the second inert gas supply system is set to 1. Therefore, the total flow rate is set to 6 in the second process gas supplying step S206.

In the second process gas supplying step S206, the pressure detector 261d detects the pressure of the process space 205. The controller 280 receives the pressure of the process space 205 detected by the pressure detector 261d. The controller 280 controls the mass flow controller 244c, the mass flow controller 246c, the mass flow controller 247c and the APC 261c such that the pressure of the process space 205 is within a predetermined range.

In the second process gas supplying step S206, for example, the flow rate of the oxygen gas is set to a predetermined flow rate ranging from 100 sccm to 6,000 sccm.

The oxygen gas is activated into the plasma state by the remote plasma mechanism (RPU) 244e. The oxygen gas in the plasma state is supplied onto the substrate 100 through the shower head 230. By modifying the silicon-containing layer formed in the deep concave structure with the oxygen gas, a film containing silicon (Si) and oxygen (O) is formed.

After a predetermined time elapses, the valve 244d is closed to stop the supply of the oxygen gas.

Similar to the first process gas supplying step S202, in the second process gas supplying step S206, the valve 261b is opened, and the controller 280 controls the APC 261c such that the pressure of the process space 205 is at a predetermined pressure.

Second Purging Step S208

The second purging step S208 will be described. Similar to the first purging step S204, by supplying the N$_2$ gas through the third gas supply pipe 245a, it is possible to purge the shower head 230 and the process space 205 in the second purging step S208.

In the second purging step S208, as shown in FIG. 11, when the flow rate of the inert gas supplied through the first inert gas supply system in the first gas supplying step S202 is set to 1 [arbitrary unit], the flow rate of the inert gas supplied through the second inert gas supply system is set to 1, and the flow rate of the inert gas supplied through the third gas supply system is set to 2. Therefore, the total flow rate is set to 4 in the second purging step S208.

In the second purging step S208, the total flow rate is set to be lower than the total flow rate of the second process gas supplying step S206, which is performed immediately before the second purging step S208, and the pressure of the process space 205 is set to the predetermined pressure lower than that of the second process gas supplying step S206. Therefore, similar to the first purging step S204, it is possible to discharge the by-products present in the upper and lower portions of the deep concave structure. Therefore, it is possible to form a layer of uniform composition on the surface of the deep concave structure.

In the second purging step S208, the pressure detector 261d detects the pressure of the process space 205. The controller 280 receives the pressure of the process space 205 detected by the pressure detector 261d. The controller 280 controls the mass flow controller 245c, the mass flow controller 246c, the mass flow controller 247c and the APC 261c such that the pressure of the process space 205 is at a predetermined pressure.

Determination Step S210

A determination step S210 will be described. The controller 280 determines whether a cycle including the first process gas supplying step S202, the first purging step S204, the second process gas supplying step S206 and the second purging step S208 is performed a predetermined number of times (n times). When the controller 280 determines, in the determination step S210, that the cycle is not performed the predetermined number of times ("NO" in S210 of FIG. 10), the step S202 through the step S208 are performed again. When the controller 280 determines, in the determination step S210, that the cycle is performed the predetermined number of times ("YES" in S210 of FIG. 10), the substrate processing shown in FIG. 10 is terminated.

Since the by-products in the lower portion of the deep concave structure are discharged in the first purging step S204 and the second purging step S208, it is possible to form a film with the continuous layer of uniform composition. That is, it is possible to form the film of uniform composition.

Substrate Unloading Step

In a substrate unloading step, the substrate support table 212 is lowered to the substrate transfer position wherein the substrate 100 is supported by the lift pins 207 protruding from the surface of the substrate support table 212. Thereafter, the gate valve 149 is opened and the substrate 100 is unloaded from the chamber 202 by the substrate transfer device such as an arm (not shown).

According to the first embodiment of the technique described herein, it is possible to form the film of uniform composition without allowing the by-products to remain at the lower portion (bottom) of the inner space of the deep concave structure even when an aspect ratio of the deep concave structure is high.

The silicon-containing gas is used as the first process gas and the oxygen ($O_2$) gas is used as the second process gas to form the silicon oxide film in the deep concave structure, the first embodiment is not limited thereto. A gas such as HCD ($Si_2Cl_6$) and TDMAS ($SiH[N(CH_3)_2]_3$), which is easily decomposed, may be used as the first process gas. A gas such as ozone gas and HO gas may be used as the second process gas instead of the $O_2$ gas. In addition, instead of the oxygen-containing gas, a nitrogen (N)-containing gas may be used as the second process gas. Particularly, since the ozone gas itself has a high energy, the ozone gas is not required to be supplied in the plasma state. Therefore, when the substrate 100 is processed at a high pressure where the plasma may be deactivated, the ozone gas may be used as the second process gas.

For example, according to the first embodiment of the technique, the $N_2$ gas is used as the inert gas. However, the first embodiment is not limited thereto. For example, a rare gas such as helium (He) gas, neon (Ne) gas and argon (Ar) gas may be used as the inert gas.

For example, according to the first embodiment, the total flow rate in the first process gas supplying step S202 is obtained by adding the flow rate of the first process gas, the flow rate of the inert gas supplied through the first inert gas supply system and the flow rate of the inert gas supplied through the second inert gas supply system. However, the first embodiment is not limited thereto. For example, the total flow rate in the first process gas supplying step S202 may be obtained by considering the flow rate of the first process gas.

For example, according to the first embodiment, the total flow rate in the second process gas supplying step S206 is obtained by adding the flow rate of the second process gas, the flow rate of the inert gas supplied through the first inert gas supply system and the flow rate of the inert gas supplied through the second inert gas supply system. However, the first embodiment is not limited thereto. For example, the total flow rate in the second process gas supplying step S206 may be obtained by considering the flow rate of the second process gas.

For example, according to the first embodiment, the total flow rate in the first purging step S204 or the total flow rate in the second purging step S208 is obtained by adding the flow rate of the inert gas supplied through the first inert gas supply system, the flow rate of the inert gas supplied through the second inert gas supply system and the flow rate of the inert gas supplied through the third gas supply system. However, the first embodiment is not limited thereto. For example, the total flow rate in the first purging step S204 or the total flow rate in the second purging step S208 may be obtained by considering the flow rate of the inert gas supplied through the first inert gas supply system and the flow rate of the inert gas supplied through the second inert gas supply system.

Second Embodiment

Hereinafter, a second embodiment of the technique will be described. A first purging step and a second purging step of a substrate processing according to the second embodiment are different from the first purging step S204 and the second purging step S208 of the substrate processing according to the first embodiment. Since other steps of the substrate processing according to the second embodiment are similar to those of the substrate processing according to the first embodiment, detailed descriptions thereof are omitted. In addition, the first purging step and the second purging step of the substrate processing according to the second embodiment correspond to the first purging step S204 and the second purging step S208 of the substrate processing according to the first embodiment.

Figure 12:
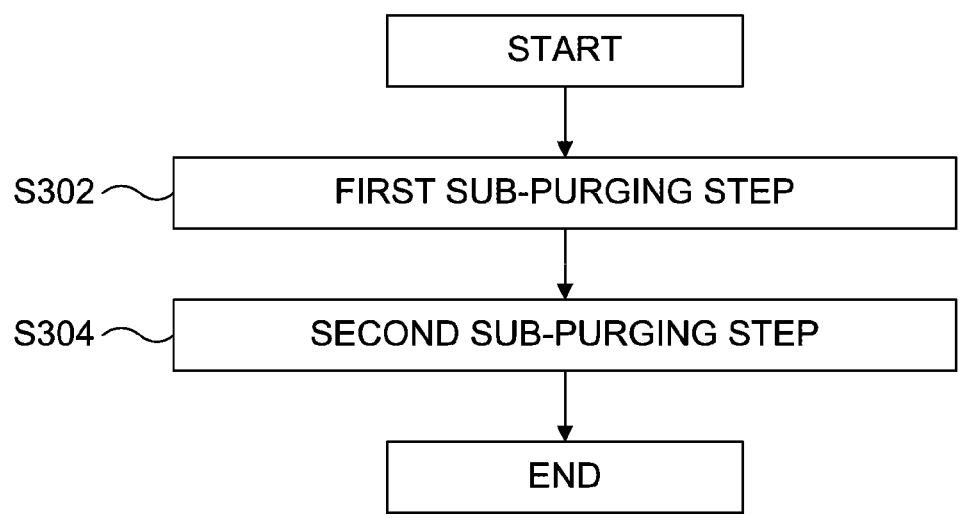
FIG. 12 is a flow chart schematically illustrating a purging step of a process flow of manufacturing a semiconductor device according to a second embodiment described herein.
Figure 13:
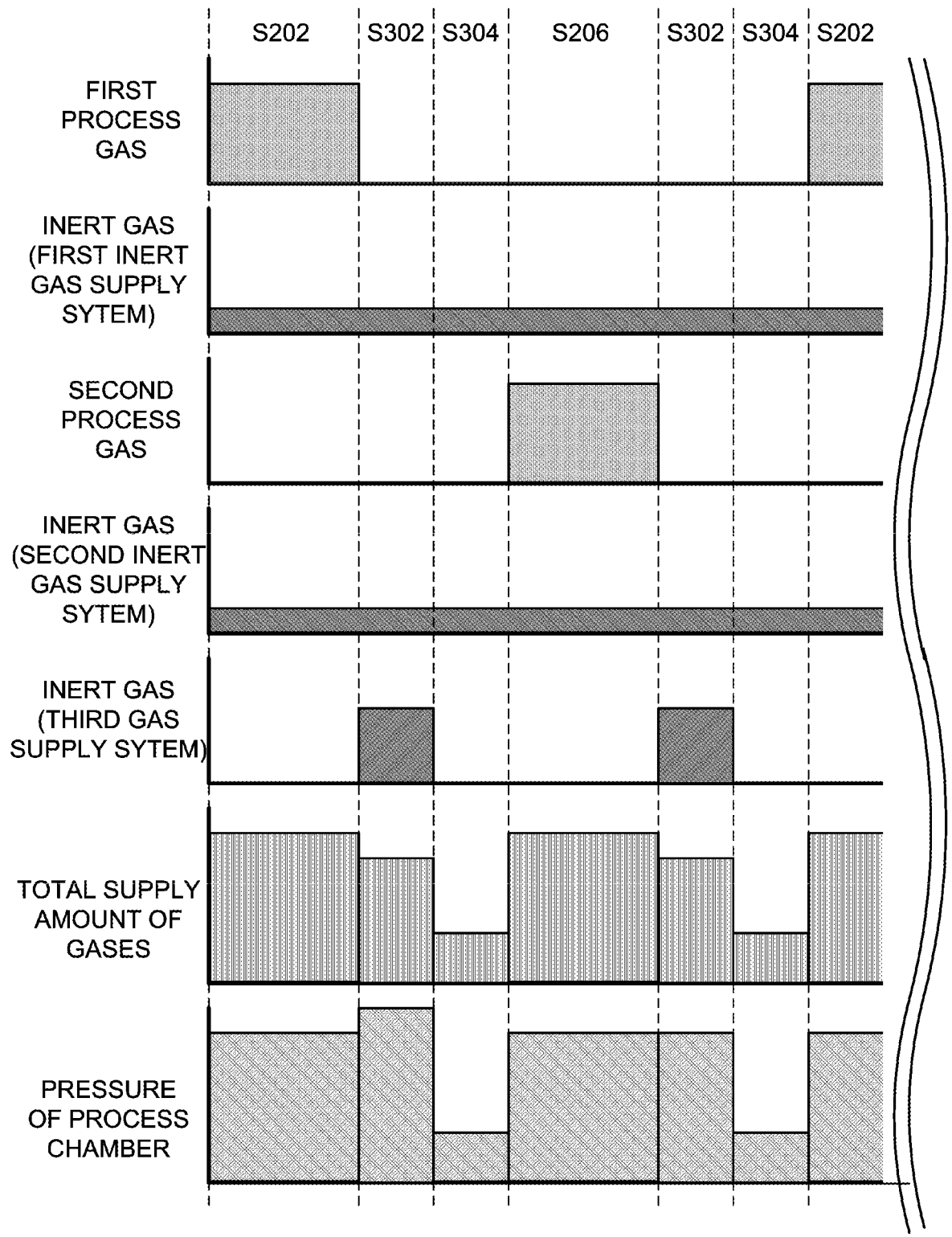
FIG. 13 schematically illustrates relations among the process flow of manufacturing the semiconductor device, the flow rates of the gases and the pressure of the process space according to the second embodiment described herein.

The first purging step and the second purging step of the substrate processing according to the second embodiment will be described with reference to FIGS. 12 and 13. The first purging step and the second purging step of the second embodiment include a plurality of sub-steps, respectively. Specifically, a first sub-purging step S302 and a second sub-purging step S304 are performed in the first purging step of the second embodiment or in the second purging step of the second embodiment. Hereinafter, the first sub-purging step S302 and the second sub-purging step S304 will be described in detail.

First Sub-purging step S302

The first sub-purging step S302 will be described. The inert gas is supplied to the process space 205 in the first sub-purging step S302. In the first sub-purging step S302, by supplying the inert gas through the first inert gas supply system, the second inert gas supply system and the third gas supply system, the pressure of the process space 205 is set (adjusted) into a high pressure state.

By setting (adjusting) the pressure of the process space 205 into the high pressure state, a large amount of the inert gas is supplied to the upper portion of the deep concave structure. The inert gas physically attacks the by-products remaining in the upper portion of the deep concave structure, and the by-products are discharged out of the deep concave structure.

In the first sub-purging step S302, the pressure of the process space 205 is set to be higher than that of the process space 205 in the first process gas supplying step S202.

It is more preferable that the inner atmosphere of the process space 205 is exhausted while supplying the large amount of the inert gas to the substrate 100. By exhausting the inner atmosphere of the process space 205 while supplying the large amount of the inert gas, the by-products discharged out of the deep concave structure are not retained on the substrate 100. Therefore, none of the by-products enter the other deep concave structure again.

Second Sub-purging step S304

Hereinafter, the second sub-purging step S304 will be described. The inert gas is supplied to the process space 205 in the second sub-purging step S304. In the second sub-purging step S304, the supply of the inert gas through the third gas supply system is stopped, and the inert gas is supplied through the first inert gas supply system and the second inert gas supply system. The valve 245d is closed to stop the supply of the inert gas through the third gas supply system.

By maintaining the supply amount (flow rate) of the inert gas supplied through the first inert gas supply system and the second inert gas supply system and by stopping the supply of the inert gas through the third gas supply system, the pressure of the process space 205 in the second sub-purging step S304 is lower than the that of the process space 205 in the first sub-purging step S302.

Therefore, as in the first embodiment, the pressure of the process space 205 is lower than the pressure of the lower portion of the deep concave structure, and as a result, it is possible to form a gas flow from the lower portion of the deep concave structure to the process space 205. According to the second embodiment, since the by-products in the upper portion of the deep concave structure are removed in the first sub-purge step S302, they no longer hinder the movement of the by-products remaining in the lower portion of the deep concave structure. Therefore, compared with the first embodiment, it is possible to remove the by-products present in the lower portion of the deep concave structure more reliably.

Hereinafter, the purpose of stopping the supply of the inert gas through the third gas supply system 245 in the second sub-purging step S304 will be described. In the third gas supply system 245, the supply amount (flow rate) of the inert gas is controlled using the WC 245c and the valve 245d.

Only the MFC 245c may be controlled as a method of decreasing the flow rate of the inert gas. However, a high-performance MFC, which can be adjusted to the extent of stopping the supply of the inert gas, is expensive, and it takes time to adjust the pressure even if the high-performance MFC is used.

In addition, as a method of lowering the pressure of the process space 205 into a low pressure state, it is possible to control the pressure of the process space 205 by controlling the APC 261c. However, it also takes time to adjust the pressure. Therefore, the productivity is decreased when the methods described above are used.

However, when the valve 245d is closed as in the second embodiment, it is possible to reduce the supply amount of the inert gas to the process space 205 for a short time. Therefore, the productivity can be increased.

In the second purging step S304, it is sufficient that at least the pressure of the process space 205 is lower than that of the first purging step S302, and the inert gas supplied through the first inert gas supply system or the inert gas supplied through the second inert gas supply system may be stopped.

Other Embodiments

While the embodiments of the technique is described by way of an example in which the film containing silicon (Si) as a main element is formed on the substrate, the above-described technique is not limited thereto. For example, the above-described technique may be preferably applied to form on the substrate a film containing a metalloid element such as germanium (Ge) and boron (B) as a main element instead of silicon. In addition, the above-described technique may be preferably applied to form on the substrate a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr) and aluminum (Al) as a main element.

According to some embodiments in the present disclosure, it is possible to form a film of uniform composition without remaining by-products at a lower portion (bottom) of an inner space of a deep concave structure even when an aspect ratio of the deep concave structure is high.

What is claimed is:
1. A method of manufacturing a semiconductor device comprising:

(a) placing a substrate comprising a deep concave structure constituted by at least an upper portion and a lower portion on a substrate support provided in a process chamber;

(b) supplying a process gas into the process chamber to form a layer on an inner surface of the deep concave structure; and (c) discharging by-products generated in an inner space of the deep concave structure in (b) by setting a pressure of a process space defined by the process chamber to be lower than a pressure of the inner space of the deep concave structure.

2. The method of claim 1, wherein an inner atmosphere of the process chamber is exhausted from the process chamber while supplying an inert gas in (c).

3. The method of claim 2, wherein a supply amount of the inert gas in (b) is less than that of the inert gas in (c).

4. The method of claim 3, wherein (c) comprises:
(c-1) purging the by-products; and
(c-2) purging the by-products performed after (c-1), wherein a pressure of the process chamber in (c-2) is lower than that of the process chamber in (c-1).

5. The method of claim 4, wherein the inner atmosphere of the process chamber is exhausted from the process chamber while supplying the inert gas to the process chamber in (c-1).

6. The method of claim 5, wherein the process chamber is in communication with at least two inert gas supply pipes provided with at least two valves in a manner that at least one valve among the at least two valves is provided at each of the at least two inert gas supply pipes, and
each of the at least two valves is opened in (c-1), and one of the at least two valves is opened whereas other of the at least two valves is closed in (c-2).

7. The method of claim 4, wherein the process chamber is in communication with at least two inert gas supply pipes provided with at least two valves in a manner that at least one valve among the at least two valves is provided at each of the at least two inert gas supply pipes, and
each of the at least two valves is opened in (c-1), and one of the at least two valves is opened whereas other of the at least two valves is closed in (c-2).

8. The method of claim 2, wherein (c) comprises:
(c-1) purging the by-products; and
(c-2) purging the by-products performed after (c-1), wherein a pressure of the process chamber in (c-2) is lower than that of the process chamber in (c-1).

9. The method of claim 8, wherein the inner atmosphere of the process chamber is exhausted from the process chamber while supplying the inert gas to the process chamber in (c-1).

10. The method of claim 9, wherein the process chamber is in communication with at least two inert gas supply pipes provided with at least two valves in a manner that at least one valve among the at least two valves is provided at each of the at least two inert gas supply pipes, and
each of the at least two valves is opened in (c-1), and one of the at least two valves is opened whereas other of the at least two valves is closed in (c-2).

11. The method of claim 8, wherein the process chamber is in communication with at least two inert gas supply pipes provided with at least two valves in a manner that at least one valve among the at least two valves is provided at each of the at least two inert gas supply pipes, and
each of the at least two valves is opened in (c-1), and one of the at least two valves is opened whereas other of the at least two valves is closed in (c-2).

12. The method of claim 1, wherein a supply amount of an inert gas in (b) is less than that of the inert gas in (c).

13. The method of claim 12, wherein (c) comprises:
(c-1) purging the by-products; and
(c-2) purging the by-products performed after (c-1), wherein a pressure of the process chamber in (c-2) is lower than that of the process chamber in (c-1).

14. The method of claim 13, wherein an inner atmosphere of the process chamber is exhausted from the process chamber while supplying the inert gas to the process chamber in (c-1).

15. The method of claim 14, wherein the process chamber is in communication with at least two inert gas supply pipes provided with at least two valves in a manner that at least one valve among the at least two valves is provided at each of the at least two inert gas supply pipes, and
each of the at least two valves is opened in (c-1), and one of the at least two valves is opened whereas other of the at least two valves is closed in (c-2).

16. The method of claim 13, wherein the process chamber is in communication with at least two inert gas supply pipes provided with at least two valves in a manner that at least one valve among the at least two valves is provided at each of the at least two inert gas supply pipes, and
each of the at least two valves is opened in (c-1), and one of the at least two valves is opened whereas other of the at least two valves is closed in (c-2).

17. The method of claim 1, wherein (c) comprises: (c-1) purging the by-products; and (c-2) purging the by-products performed after (c-1), wherein a pressure of the process chamber in (c-2) is lower than that of the process chamber in (c-1).

18. The method of claim 17, wherein the inner atmosphere of the process chamber is exhausted from the process chamber while supplying the inert gas to the process chamber in (c-1).

19. The method of claim 18, wherein the process chamber is in communication with at least two inert gas supply pipes provided with at least two valves in a manner that at least one valve among the at least two valves is provided at each of the at least two inert gas supply pipes, and
each of the at least two valves is opened in (c-1), and one of the at least two valves is opened whereas other of the at least two valves is closed in (c-2).

* * * * *